(12) United States Patent
Contes

(10) Patent No.: US 7,857,139 B2
(45) Date of Patent: Dec. 28, 2010

(54) INVERTIBLE FRONT OPENING UNIFIED POD

(75) Inventor: Andrew N. Contes, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 657 days.

(21) Appl. No.: 11/860,328

(22) Filed: Sep. 24, 2007

(65) Prior Publication Data

US 2009/0081014 A1    Mar. 26, 2009

(51) Int. Cl.
    *B65D 85/00*    (2006.01)
(52) U.S. Cl. .............. 206/710; 206/711; 211/41.18; 414/217; 414/416.02; 414/810; 414/941
(58) Field of Classification Search .......... 414/217, 414/416.02, 941, 810; 211/41.18; 206/710, 206/711
    See application file for complete search history.

(56) References Cited

U.S. PATENT DOCUMENTS

| | | | | |
|---|---|---|---|---|
| 5,960,959 A | * | 10/1999 | Wu et al. | 206/710 |
| 6,427,096 B1 | * | 7/2002 | Lewis et al. | 700/228 |
| 6,573,522 B2 | * | 6/2003 | Elliott et al. | 250/559.4 |
| 6,981,594 B1 | * | 1/2006 | Sarver | 206/710 |
| 2008/0273959 A1 | * | 11/2008 | Bunod et al. | 414/801 |

FOREIGN PATENT DOCUMENTS

| | | | |
|---|---|---|---|
| JP | 07161805 | * | 6/1995 |
| JP | 2000355392 | * | 12/2000 |
| WO | WO2007147120 | * | 6/2007 |

* cited by examiner

*Primary Examiner*—Michael S Lowe
(74) *Attorney, Agent, or Firm*—Cool Patent, P.C.; Joseph P. Curtin

(57) ABSTRACT

A front opening unified pod (FOUP) for holding wafers is invertible and compatible with process machines in an inverted orientation. The FOUP can safely transport and store wafers while in a non-upright orientation. The shelves within the FOUP are capable of collapsing and constraining the wafers. Further, a method of holding wafers for processing is provided.

14 Claims, 3 Drawing Sheets

INVERTIBLE FRONT OPENING UNIFIED POD

BACKGROUND

A front-opening unified pod (FOUP) is constructed to hold semiconductor wafers securely and safely in a controlled environment. FOUPs allow wafers to be removed for processing or measurement by machines equipped with load ports and robotic handling systems. Referring to FIGS. 1 and 2, a conventional FOUP is shown at 1A. FOUP 1A includes a container 1B enclosing a volume 1C to hold the wafers. Each of the top and side surfaces 1D of the FOUP has-attached carrying handles 1E for transport and placement of the FOUP. The bottom surface of the FOUP has three point supports 1F for coupling with load ports of processing machines.

Certain processing and metrology machines require that the wafer orientation be upside down during processing. These machines have internal robots that handle the wafer to flip it for processing and then flip it back to standard orientation before returning it to the FOUP. These robots are complex and reduce the throughput of the machines because time is consumed in slowly handling and flipping each wafer. Currently, there is no bulk flipping solution.

These flipping robots induce vibration and undesirable mechanical handling, and increase the chance of wafer damage. In addition, these robots are currently unable to handle thinned wafers and would require changes in end effector designs for multiple machines including wafer thinning, backside metallization (BSM), thin film resistance (TFR), and film thickness monitor (FTM).

BRIEF DESCRIPTION OF THE DRAWINGS

The claimed subject matter will be understood more fully from the detailed description given below and from the accompanying drawings of disclosed embodiments which, however, should not be taken to limit the claimed subject matter to the specific embodiment(s) described, but are for explanation and understanding only.

DETAILED DESCRIPTION

Figure 1:
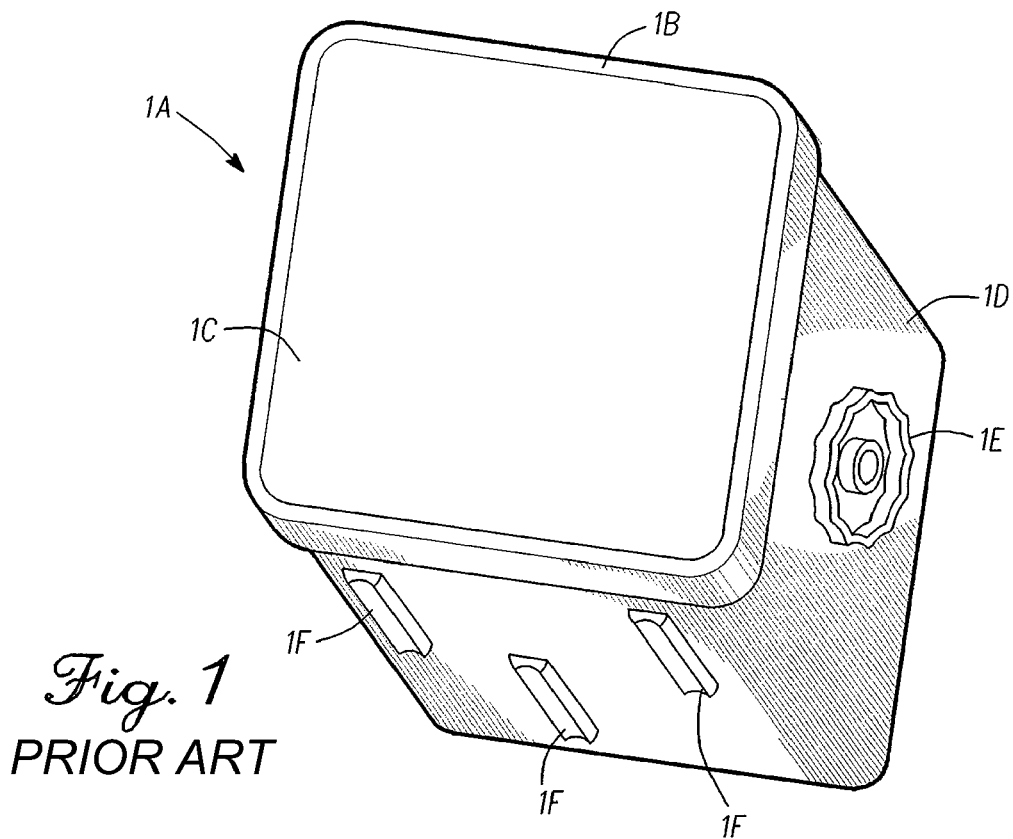
FIG. 1 is a bottom perspective view of a conventional front opening unified pod (FOUP).
Figure 2:
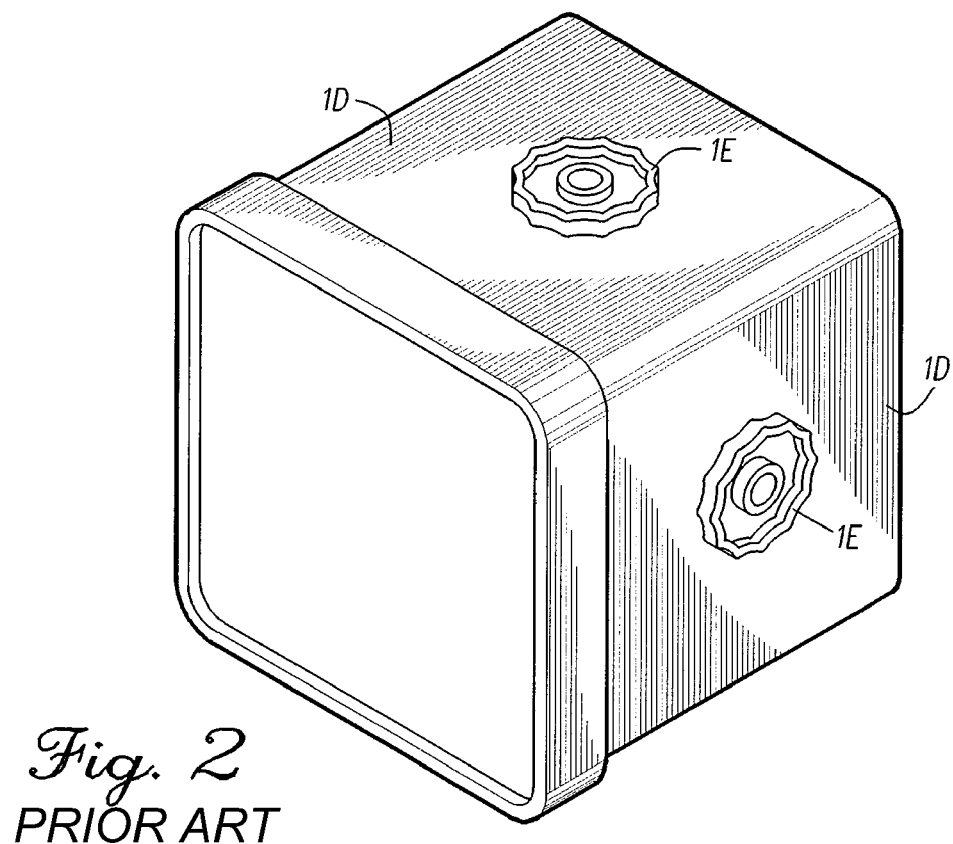
FIG. 2 is a top perspective view of the conventional FOUP of FIG. 1.
Figure 3:
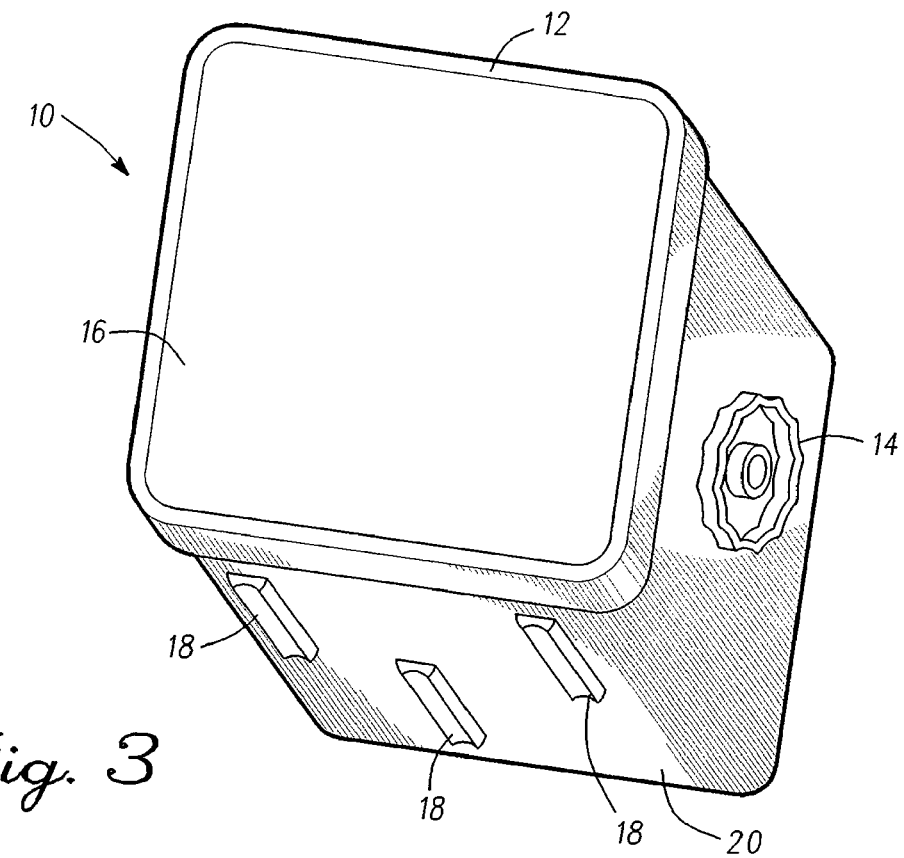
FIG. 3 is a bottom perspective view of a FOUP in accordance with one embodiment.
Figure 4:
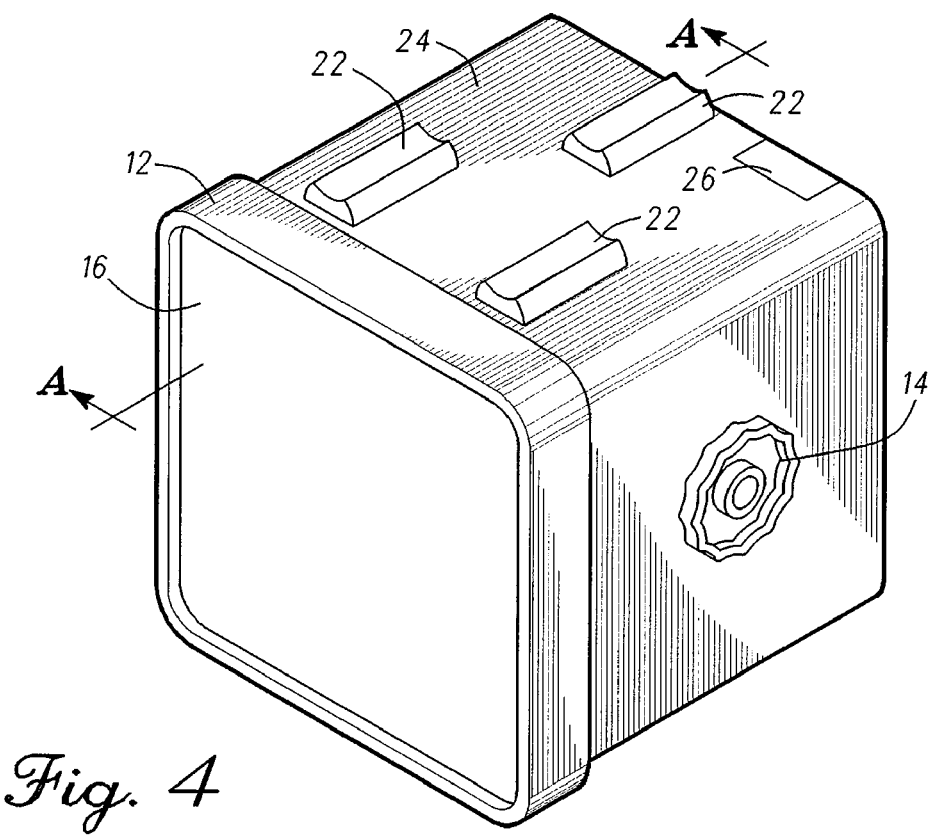
FIG. 4 is a top perspective view of the FOUP of FIG. 3.

Referring to FIGS. 3-4, a front-opening unified pod (FOUP) 10 is shown in accordance with one embodiment. FOUP 10 includes a container 12 for transporting wafers to and from processing machines (not shown). The sides of the FOUP include a carrying handle 14 for handling by an operator. The FOUP may be oriented in a non-upright position without causing damage to the wafers. In addition, the FOUP may be inverted (oriented upside down) so that the wafers within can be processed without an additional step (undertaken by a processing machine) of flipping over the wafers. The FOUP may also be transported or stored right-side up or upside down.

The FOUP further includes a door (not shown) coupling to the container to create a sealed environment for the wafers (not shown). Generally, for wafer processing, the FOUP is coupled to a processing machine where after the door is opened, the machine removes the wafers through a container opening 16. After processing, the machine returns the wafers to the FOUP and the door is closed to re-secure the controlled environment. The FOUP may be transported to another processing machine for further processing of the wafers. Wafer processing may include any active or passive actions performed on the wafers, for example, fabrication, diffusion, coat-bake, align, develop, etching, photolithography, masking, encapsulation, testing, etc.

The FOUP 10 is configured for coupling to processing machines via point supports 18 located on the bottom surface 20 of the container 12. In one embodiment, the FOUP uses three point supports for coupling to a standard processing machine with one load port. The point supports may be configured to be compatible with load ports of other processing machines.

The FOUP 10 further includes point supports 22 on the top surface 24 of container 12. These point supports allow coupling to the load ports of processing machines when the FOUP is oriented upside down. In one embodiment, the geometry of the top surface 24 is similar to the geometry of the bottom surface 20 to enable processing of the wafers regardless of whether the FOUP is oriented right-side up or upside down. The bottom surface and the top surface of the FOUP may be symmetrical or identical.

The FOUP may also include an indicator 26 such as a sensor, notch, peg, tag, or other characteristic on either the top or bottom surface so that the machine can detect position and/or orientation of the FOUP automatically. This is a safety feature that may be added to ensure correct placement and prevent processing of the wrong surface of the wafer. Further, the indicator may be helpful to processing machines with and without flipping capability. For example, when a processing machine fully equipped with flipping robots receives a FOUP for processing, it may be useful for the machine to recognize that it does not need to flip the wafers before processing. In one embodiment, the indicator may be located anywhere on the FOUP that can indicate the orientation of the wafer. In one embodiment, there may be multiple indicators located on different surfaces of the FOUP.

Figure 5:
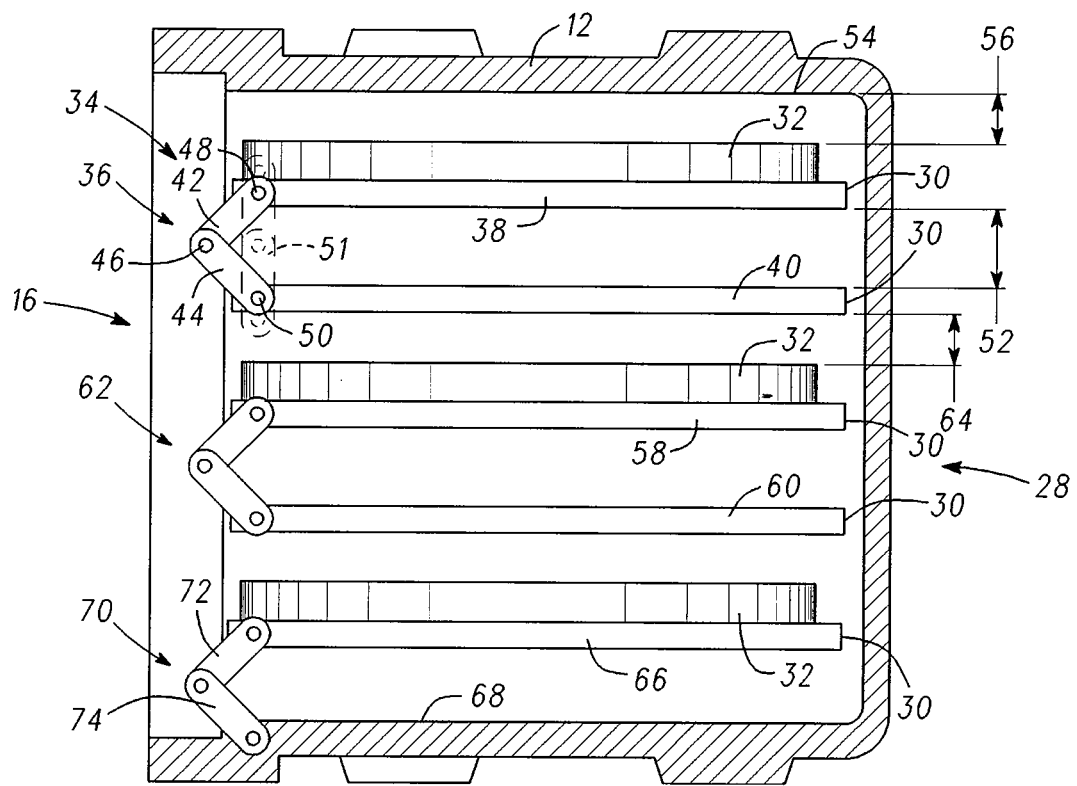
FIG. 5 is a cross sectional view of the FOUP of FIG. 4, taken along line A-A.
Figure 6:
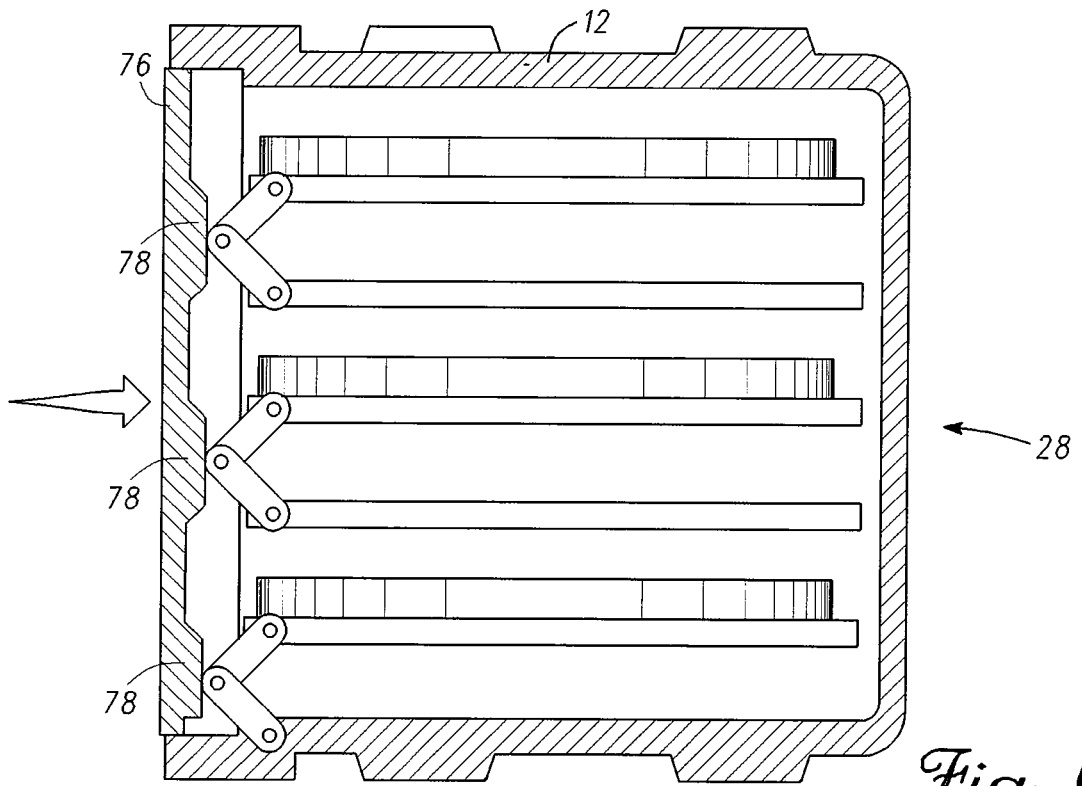
FIG. 6 shows FIG. 5 with a FOUP door according to one embodiment.

Referring to FIGS. 5 and 6, a cross sectional view of the FOUP of FIG. 4, taken along line A-A, is shown at 28. Inside the container 12, the FOUP may include shelves 30 (labeled individually below) and padding 32 for holding wafers (not shown). Although the figures show five shelves for three levels of wafer locations, it is understood that the number of shelves may vary and the number of levels for wafer placement would vary accordingly. Further, the FOUP includes a mechanism 34 for constraining wafer movement.

The shelves 30 provide a substantially flat surface where wafers may be safely supported. The position of the shelves 30 may be adjustable. In one embodiment, some shelves are stationary while other shelves move, as will be described in more detail below.

Padding 32 may be added to one or more of the shelves to provide additional wafer cushioning and/or grip. Generally, the padding lines the top surface of the shelves and the wafers are placed on top of the padding. Padding may include any addition of material applied to the wafer shelves. Examples of padding may include pads, tape, cushions, fabric, resin, etc. In one embodiment, no padding is required. For example, the wafer shelves may have a surface geometry or texture that sufficiently grips the wafers without the addition of a gripping aid.

It is noted that although only shown on the top of the shelves, padding may be placed on the bottom of the shelves instead. In one embodiment, both the top and bottom of the shelves may be lined with padding. Inside the FOUP, any surface may be padded. For example, certain portions of the inner surface of the container may be padded for retaining wafers. Due to padding, back grind tape may not be required to hold the wafers in place.

The mechanism 34 is configured to secure the wafers inside the FOUP. More specifically, the mechanism adjusts the distance between shelves to clamp the wafers in place. This may also be referred to as "collapsing the shelves." The mechanism may include linkages 36 for coupling shelves 38 and 40 together. Linkages 36 may be affixed to the shelves via nuts, bolts, screws, pins, or other fasteners. In one embodiment, as shown in the figure, linkage 36 includes two bars 42, 44 joined by a pin 46 coupling adjacent ends of each bar. The other end of bar 42 pivots about a pin 48 coupled to shelf 38, and the other end of bar 44 pivots about a pin 50 coupled to shelf 40. The bars are allowed to move with respect to each other, and can change the position of the adjoining shelves 38 and 40. One shelf 38 is configured to move upward, while the other shelf 40 is configured to move downward. The linkages are configured to correlate the movement of the two adjoining shelves 38 and 40. Additional linkages may couple other adjacent shelves together. All of the linkages may be configured to move the shelves into predetermined positions for constraining the wafers.

When the linkages are folded (bars angled), the shelves are not in position to constrain the wafers. To collapse the shelves, a force is applied (in this view, from the left) to the linkages causing the bars to straighten to a substantially vertical orientation, as shown by the dashed lines at 51. In straightening the bars, the linkage moves the shelf 38 upward and the shelf 40 downward, thus increasing the distance 52 between shelves 38 and 40.

While the shelf 38 moves upward, it works in conjunction with a top side 54 of the container 12 to sandwich the wafers. The distance 56 between shelf 38 and top side 54 decreases until a predetermined pressure is applied to wafers resting on the shelf 38.

At the same time, as the shelf 40 moves downward, it works in conjunction with an adjacent shelf 58 below to sandwich the wafers. Adjacent shelf 58 is coupled to a shelf 60 via a linkage 62. These adjoining shelves 58 and 60 behave similarly to shelves 38 and 40, respectively. The distance 64 between shelf 40 and shelf 58 decreases until a predetermined pressure is applied to wafers resting on the shelf 58.

As shown in FIG. 5, the bottommost shelf 66 of the FOUP is coupled to the bottom 68 of the container via linkage 70. When rods 72 and 74 of the linkage straighten, the shelf 66 moves upward to work with the shelf 60 (above) to constrain wafers resting on top of shelf 66.

In one embodiment, select shelves may be held stationary and the adjoining shelves may be configured for securing wafers. For example, shelves 40 and 60 may be fixed while shelves 38 and 58 move upward until a predetermined pressure is applied to the wafers on each of the shelves.

It is noted that any component within the FOUP may be configured to allow the shelves to achieve a predetermined pressure to hold the wafers. For example, there may be a lock, stop, spring, or other tool to prevent the bars from moving beyond a predetermined position (such as vertical) to create a predetermined pressure. Allowances for adjustments to the amount of pressure to hold the wafers may also be included. For example, a number of parameters may vary, such as: spacing in between shelves, padding thickness, shelf thickness, wafer thickness, dimensions and characteristics of the linkages, etc. In one embodiment, support of thinned wafers is possible by fitting the FOUP with specially designed shelves suitable for thinned wafers.

The scope of the claimed subject matter includes other mechanisms in which the shelves may be collapsed to hold the wafers securely. The scope of the claimed subject matter also extends to other methods and mechanisms for inverting the FOUP without damage to the wafers. There is no requirement to collapse the shelves in a certain direction or using any specific method. Further, there may be additional supportive structure provided to the shelves, for example, additional linkages or supports situated around the shelves inside the container.

Actuation of the mechanism may be mechanical or electrical. In mechanical actuation, the mechanism may be actuated by a lever, spring, gravity, or other device. As depicted in one embodiment as shown in FIG. 6, a FOUP door 76 may be configured to actuate the mechanism for constraining wafer movement.

The FOUP door includes protrusions 78, spaced apart on the door, configured to contact the linkages. Before the door is closed all the way, such as shown, the protrusions come in contact with the linkages. As the door closes tightly, the protrusions push against the linkages causing the bars to straighten and align vertically, thus moving the shelving into position to constrain the wafers. In one embodiment, the protrusions may be separate attachments lo the FOUP door.

As the FOUP door closes, the mechanism may automatically readjust the distance between shelving to constrain the wafers regardless of the specific orientation of the FOUP, that is, whether it is upside down or right-side up. In an alternate embodiment, the shelving is readjusted and the wafer movement is constrained only upon a determination that the wafers in the FOUP need to be flipped for certain types of processing.

In one embodiment, when the door is opened, the shelves automatically separate and release the clamping hold on the wafers. This allows immediate access by a process machine or operator to the wafers. The automatic response may be mechanical and devised by applying a bias to the linkages to result in a predisposition to fold the linkages during opening.

Aside from invertible capability, the FOUP may conform to any industry standards such as SEMI standards for wafer transport and storage. For example, the FOUP may have a wafer capacity of 25, typical of a FOUP, however, this number may increase or decrease depending on the standards and applications. In addition, the shelf spacing is also a SEMI standard and would be met when the shelves are relaxed.

As another aspect in accordance with one or more embodiments, a method of holding wafers for processing is disclosed. The method includes inserting wafers into a container enclosing shelves. Both the top surface and bottom surface of the container is capable of coupling with a load port of a processing machine. The method further includes securing a door on the container and collapsing the shelves to constrain movement of the wafers. The method may include inverting the container for processing. Since the wafers within the FOUP may be secure in any orientation, the actual flipping of the FOUP may be handled manually by an operator or with the assistance of a modified personal guided vehicle (PGV). The method may include coupling the container to a processing machine without flipping capability for backside processing of the wafers. By securing the door on the container, the shelves may be configured to automatically collapse regardless of the orientation of the FOUP.

It is appreciated that an invertible front opening unified pod has been explained with reference to one general exemplary embodiment, and that the disclosed subject matter is not limited to the specific details given above. References in the specification made to other embodiments fall within the scope of the claimed subject matter.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the claimed subject matter. Indeed, the invention is not limited to the details described above. Rather, it is the following claims including any amendments thereto-that define such-scope and variations.

What is claimed is:

1. An apparatus for holding wafers, comprising:
   a plurality of shelves capable of holding wafers;
   a container enclosing the shelves and allowing access to the shelves, the container comprising a top surface and a bottom surface, both surfaces capable of coupling with a load port of a processing machine, the container comprising substantially identical top and bottom surfaces to allow the container to be normally oriented or inverted, and at least one of the shelves being stationary with respect to the container; and wherein two of the shelves are stationary with respect to each other,
   a door securable to the container; and
   a mechanism capable of adjusting distance in between the shelves to constrain wafer movement when the container is normally oriented or inverted.

2. The apparatus of claim 1, wherein the plurality of shelves are padded to protect and support wafers.

3. The apparatus of claim 1, wherein the plurality of shelves are capable of holding thinned wafers.

4. The apparatus of claim 3, wherein back grind tape is not required.

5. The apparatus of claim 1, wherein the mechanism collapses the shelves with respect to each other upon actuation of the mechanism.

6. The apparatus of claim 5, wherein the mechanism is lever-actuated.

7. The apparatus of claim 5, wherein the mechanism is gravity-actuated.

8. The apparatus of claim 1, wherein the mechanism comprises linkages capable of moving the shelves with respect to each other.

9. The apparatus of claim 1, wherein upon securing the door, the mechanism automatically collapses the shelves with respect to each other.

10. The apparatus of claim 1, further comprising point supports located on the top surface.

11. The apparatus of claim 1, further comprising an indicator capable of indicating at least one of a position or orientation of the container to the processing machine.

12. A method of holding wafers for processing, the method comprising:
    inserting wafers into a container enclosing a plurality of shelves, the container comprising a top surface and a bottom surface, both surfaces being capable of coupling with a load port of a processing machine, and at least one of the shelves being stationary with respect to the container; and where two of the shelves are stationary with respect to each other,
    securing a door on the container;
    collapsing the shelves with respect to each other to constrain movement of the wafers; and
    inverting the container.

13. The method of claim 12, further comprising coupling the container to a processing machine without flipping capability for processing.

14. The method of claim 12, wherein securing the door on the container automatically collapses the shelves with respect to each other.

* * * * *

UNITED STATES PATENT AND TRADEMARK OFFICE
CERTIFICATE OF CORRECTION

| | | |
|---|---|---|
| PATENT NO. | : 7,857,139 B2 | Page 1 of 1 |
| APPLICATION NO. | : 11/860328 | |
| DATED | : December 28, 2010 | |
| INVENTOR(S) | : Andrew N. Contes | |

It is certified that error appears in the above-identified patent and that said Letters Patent is hereby corrected as shown below:

In column 6, line 35, in Claim 12, delete "where" and insert -- wherein --, therefor.

Signed and Sealed this
Fourteenth Day of June, 2011

David J. Kappos
*Director of the United States Patent and Trademark Office*